United States Patent
Yamazoe

(10) Patent No.: US 7,359,033 B2
(45) Date of Patent: Apr. 15, 2008

(54) EXPOSURE METHOD AND APPARATUS

(75) Inventor: Kenji Yamazoe, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 78 days.

(21) Appl. No.: 11/363,038

(22) Filed: Feb. 28, 2006

(65) Prior Publication Data
US 2006/0197934 A1  Sep. 7, 2006

(30) Foreign Application Priority Data
Mar. 1, 2005  (JP) ............... 2005-056007

(51) Int. Cl.
G03B 27/42  (2006.01)
(52) U.S. Cl. .................... 355/53; 355/67
(58) Field of Classification Search ............. 355/53, 355/67, 71, 76
See application file for complete search history.

(56) References Cited

U.S. PATENT DOCUMENTS

| 6,992,750 | B2 * | 1/2006 | Kawashima et al. | ....... 355/30 |
| 7,090,964 | B2 * | 8/2006 | Baba-Ali et al. | ....... 355/67 |
| 2002/0177048 | A1 | 11/2002 | Saitoh et al. | ....... 430/5 |
| 2004/0057036 | A1 | 3/2004 | Kawashima et al. | ....... 355/77 |
| 2005/0037267 | A1 | 2/2005 | Yamazoe et al. | ....... 430/5 |

FOREIGN PATENT DOCUMENTS

| JP | 2003-234285 | 8/2003 |
| JP | 2005-55878 | 3/2005 |
| WO | WO 2004/077154 A2 | 9/2004 |

OTHER PUBLICATIONS

Baba-Ali, Nabila, et al., "Overcoming the Resolution Challenge Using Special Illumination Techniques to Print 50/50 nm Nested Contact Holes at 157 nm Wavelength," Optical Microlithography XVI, Proceedings of SPIE, vol. 5040 (2003), pp. 1352-1362, Jun. 2003.

Smith, Bruce W., et al. "Benefiting from polarization—effects on high-NA imaging," Optical Microlithography XVII, Proceedings of SPIE, vol. 5377, (Bellingham, WA, 2004). pp. 68-79, May 2004.

(Continued)

Primary Examiner—D. Rutledge
(74) Attorney, Agent, or Firm—Fitzpatrick, Cella, Harper & Scinto

(57) ABSTRACT

An exposure method for exposing an image of a mask pattern onto a plate via a projection optical system. The method includes a step of illuminating one of a binary mask and an attenuated phase shifting mask, which has a contact hole pattern and an auxiliary pattern, by utilizing light from a light source and an illumination optical system so that the contact hole pattern can be resolved, but a resolution of the auxiliary pattern is restrained. The illuminating step uses an off-axis illumination that is polarized in a tangential direction when a value that is calculated by normalizing half the length of an interval between centers of the auxiliary pattern and the contact hole pattern that are adjacent to each other by $\lambda/NA$ is $0.25 \times \sqrt{2}$ or smaller, where $\lambda$ is a wavelength of the light, and NA is a numerical aperture of the projection optical system at an image side.

12 Claims, 12 Drawing Sheets

OTHER PUBLICATIONS

Matsuura, Seiji, et al. "Intrinsic Problem Affecting Contact Hole Resolution in Hyper NA Era," 2004 International Microprocesses and Nanotechnology Conference (MNC2004), Oct. 27, 2004, No. 27A-3-2. pp. 36-37.

European Search Report dated Oct. 3, 2007, issued in corresponding European patent application No. EP 06 11 0470, forwarded in a Communication dated Nov. 2, 2007.

Smith, Bruce, et al. "Challenges in high NA, polarization, and photoresists," Optical Microlithogrpahy XV, Proceedings of SPIE, vol. 4691 (2002), pp. 11-24.

* cited by examiner

EXPOSURE METHOD AND APPARATUS

BACKGROUND OF THE INVENTION

The present invention relates generally to exposure, and, more particularly, to an exposure method and apparatus, and a method of manufacturing various devices including semiconductor chips such as ICs and LSIs, display devices such as liquid crystal panels, sensing devices such as magnetic heads, and image pick-up devices such as CCDs, as well as a mask used for micromechanics. Here, the term micromechanics refers to technology for applying the semiconductor IC fabricating technique for fine structure fabrications, thereby creating an enhanced mechanical system that may operate at a level of a micron. The inventive exposure method and apparatus are suitable, for example, for so-called immersion exposure that immerses, in a liquid, a space between a surface of a plate to be exposed and a final surface of a projection optical system, and to expose the plate via the projection optical system and the liquid.

A conventional projection exposure apparatus uses a projection optical system to expose a circuit pattern of a mask (reticle) onto a wafer, etc. A high-resolution exposure apparatus is increasingly demanded. One known solution for the high resolution is to increase a numerical aperture ("NA") of the projection optical system.

As the increasing NA scheme advances, influence of polarization of light on the imaging performance becomes non-negligible, because the imaging performance becomes different according to polarization directions of the light as an incident angle of the light upon the wafer increases. The influence of the polarization of the light on the imaging performance for the two-beam interference is much greater than that for the three-beam interference. In particular, the recently-proposed immersion exposure problematically has a condition under which no image is formed at all due to the polarization direction of the light.

Therefore, control over the polarization of the exposure light is attempted. See, for example, Proceedings of SPIE, Vol. 5377 (2004), p. 68 ("Reference 1" hereinafter). Reference 1 discusses the polarization control over a line and space ("L/S") pattern. The polarization control over a contact hole pattern is also studied, because the polarized illumination suitable for the L/S pattern is not always applicable to the contact hole pattern. See, for example, Proceedings of SPIE, Vol. 5040 (2003), p. 1352 ("Reference 2" hereinafter). See also "Intrinsic Problem Affecting Contact Hole Resolution in Hyper NA Era," 2004 International Microprocesses and Nanotechnology Conference (MNC2004), Oct. 27, 2004, No. 27A-3-2 ("Reference 3" hereinafter).

The s-polarized light or the tangentially polarized light in which an effective light source is polarized in its tangential direction is suitable for a resolution of the L/S pattern, according to Reference 1. On the other hand, for the contact hole pattern, Reference 2 states that the effective polarized light for a dense contact hole pattern is a radially polarized light in which an effective light source is polarized in a radial direction. Reference 3 states, however, that no effective polarized illumination is found at present for the dense contact hole pattern. The contact holes include so-called dense contact holes having crowded contact holes, an isolated contact hole that is an optically isolated or a periodic contact hole, and a semi-dense contact hole that is between the dense contact holes and the isolated contact hole. A contact hole pattern usually includes one or more of the above types.

BRIEF SUMMARY OF THE INVENTION

The present invention is directed to an exposure method and apparatus that provides a polarized illumination condition suitable for a contact hole pattern.

An exposure method according to one aspect of the present invention for exposing a dense contact hole pattern onto a plate via a projection optical system includes the step of illuminating one of a binary mask and an attenuated phase shifting mask (or a half-tone mask), which has the dense contact hole pattern by utilizing light from a light source and an illumination optical system, wherein the illuminating step uses an off-axis illumination that is polarized in a tangential direction (or tangentially polarized illumination) when a value that is directed to half of an interval between centers of two adjacent contact holes in the dense contact hole pattern and is normalized by $\lambda/NA$ is $0.25\times\sqrt{2}$ or smaller, where $\lambda$ is a wavelength of the light, and NA is a numerical aperture of the projection optical system at an image side.

An exposure method according to another aspect of the present invention for exposing a predetermined pattern onto a plate via a projection optical system includes the step of illuminating one of a binary mask and an attenuated phase shifting mask, which has a contact hole pattern, by utilizing light from a light source and an illumination optical system so that the predetermined pattern can be resolved, but a resolution of an auxiliary pattern is restrained, the contact hole pattern including the predetermined pattern including a contact hole, and the auxiliary pattern being smaller than the predetermined pattern, wherein the illuminating step uses an off-axis illumination that is polarized in a tangential direction when a value that is directed to half of an interval between centers of two adjacent patterns in the contact hole pattern and is normalized by $\lambda/NA$ is $0.25\times\sqrt{2}$ or smaller, where $\lambda$ is a wavelength of the light, and NA is a numerical aperture of the projection optical system at an image side.

An exposure method according to still another aspect of the present invention for exposing a predetermined pattern onto a plate via a projection optical system includes the step of illuminating one of a binary mask and an attenuated phase shifting mask, which has a contact hole pattern by utilizing light from a light source and an illumination optical system so that the predetermined pattern can be resolved but a resolution of an auxiliary pattern is restrained, the contact hole pattern including the predetermined pattern including a contact hole, and the auxiliary pattern smaller than the predetermined pattern, wherein the illuminating step uses an off-axis illumination that is polarized in a radial direction (or radially polarized illumination) when a value that is directed to half of an interval between centers of two adjacent patterns in the contact hole pattern and is normalized by $\lambda/NA$ is $0.25\times\sqrt{2}$ or greater, where $\lambda$ is a wavelength of the light, and NA is a numerical aperture of the projection optical system at an image side.

An exposure method according to another aspect of the present invention for exposing a predetermined pattern onto a plate via a projection optical system includes the step of illuminating a mask having a contact hole pattern by utilizing light from a light source and an illumination optical system so that the predetermined pattern can be resolved, but a resolution of an auxiliary pattern is restrained, the contact hole pattern including the predetermined pattern including a contact hole, and the auxiliary pattern being smaller than the predetermined pattern, wherein the illuminating step controls a polarization state of the light in accordance with a period of the contact hole pattern.

An exposure apparatus according to another aspect of the present invention includes a mode for executing the above exposure method.

An exposure apparatus according to another aspect of the present invention includes an illumination optical system for illuminating a mask having a contact hole pattern by utilizing light from a light source, a projection optical system for projecting the contact hole pattern onto a plate to be exposed, and a unit for setting a polarization state of the light for illuminating the mask based on a period of the contact hole pattern and a type of the mask.

A device manufacturing method according to another aspect of the present invention includes the steps of exposing a plate using the above exposure apparatus, and developing the plate that has been exposed. Claims for a device manufacturing method that exhibits an operation similar to that of the above exposure apparatus cover devices such as intermediate and final products. Such devices include semiconductor chips such as an LSI and a VLSI, CCDs, LCDs, magnetic sensors, thin film magnetic heads, and the like.

Other objects and further features of the present invention will become readily apparent from the following description of the preferred embodiments with reference to the accompanying drawings.

DETAILED DESCRIPTION OF THE PREFERRED EMBODIMENTS

Assume that $\lambda$ is a wavelength of the exposure light in an exposure apparatus, NA is a numerical aperture of a projection optical system at an image side, and $\sigma$ is a ratio between a numerical aperture of an illumination optical system at a mask side and a numerical aperture of the projection optical system at an object side. While $\sigma$ depends upon various components in the illumination optical system in the exposure apparatus, the maximum $\sigma$ in a typical exposure apparatus is less than one, although it is reported that an exposure apparatus that has $\sigma$ that is approximately one has recently been developed.

The exposure apparatus can use various NAs and $\lambda$s, and thus it is convenient to normalize a pattern size by ($\lambda$/NA). For example, when $\lambda$ is 248 nm and NA is 0.73, 100 nm is normalized to 0.29 as described above. This normalization is referred to as a k1 conversion in this specification. The smaller the k1 converted value is, the more difficult the exposure becomes.

As described above, the contact holes include so-called dense contact holes, an isolated contact hole, and a semi-dense contact hole. The contact hole pattern usually includes one or more of the above types. The initial study addresses a mask pattern that includes only dense contact holes.

Figure 2:
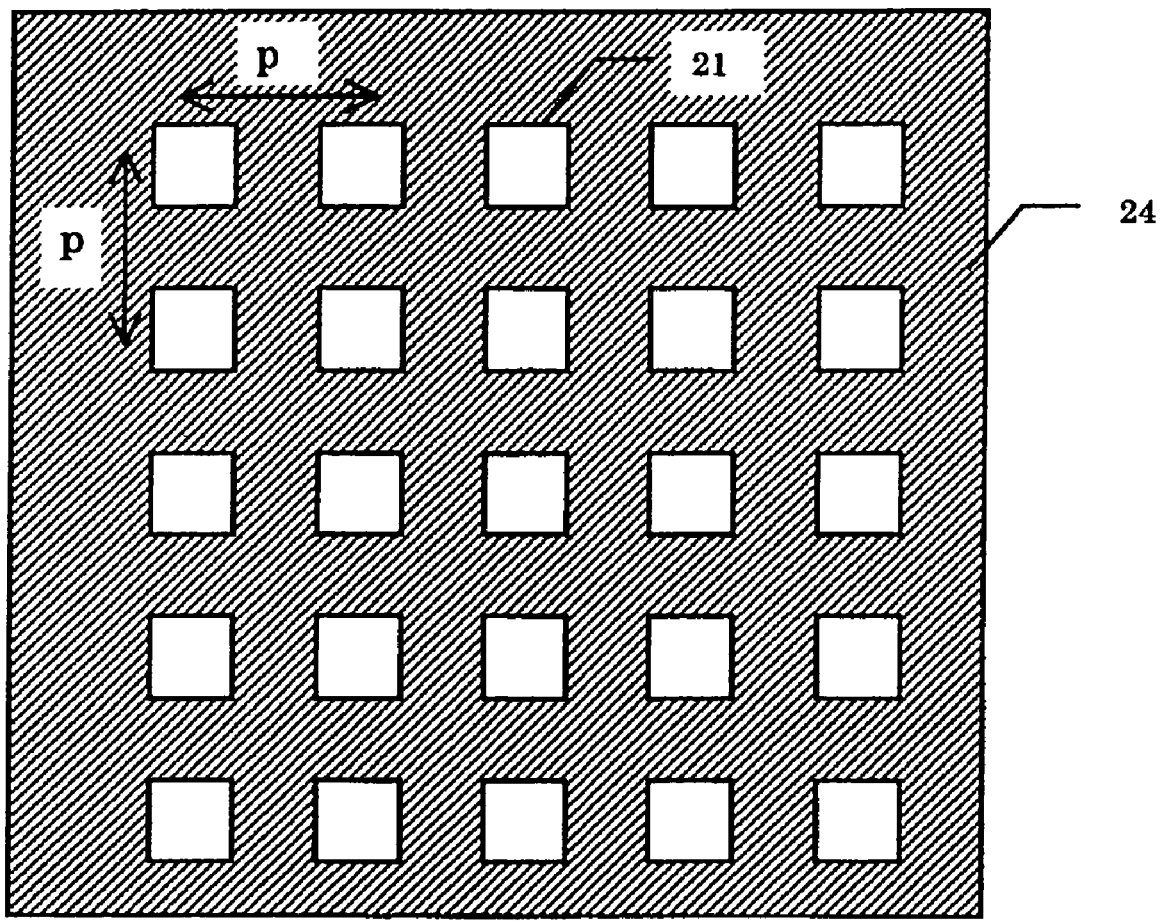
FIG. 2 is a schematic plan view of a dense contact hole pattern applicable to the mask shown in FIG. 1.
Figure 3:
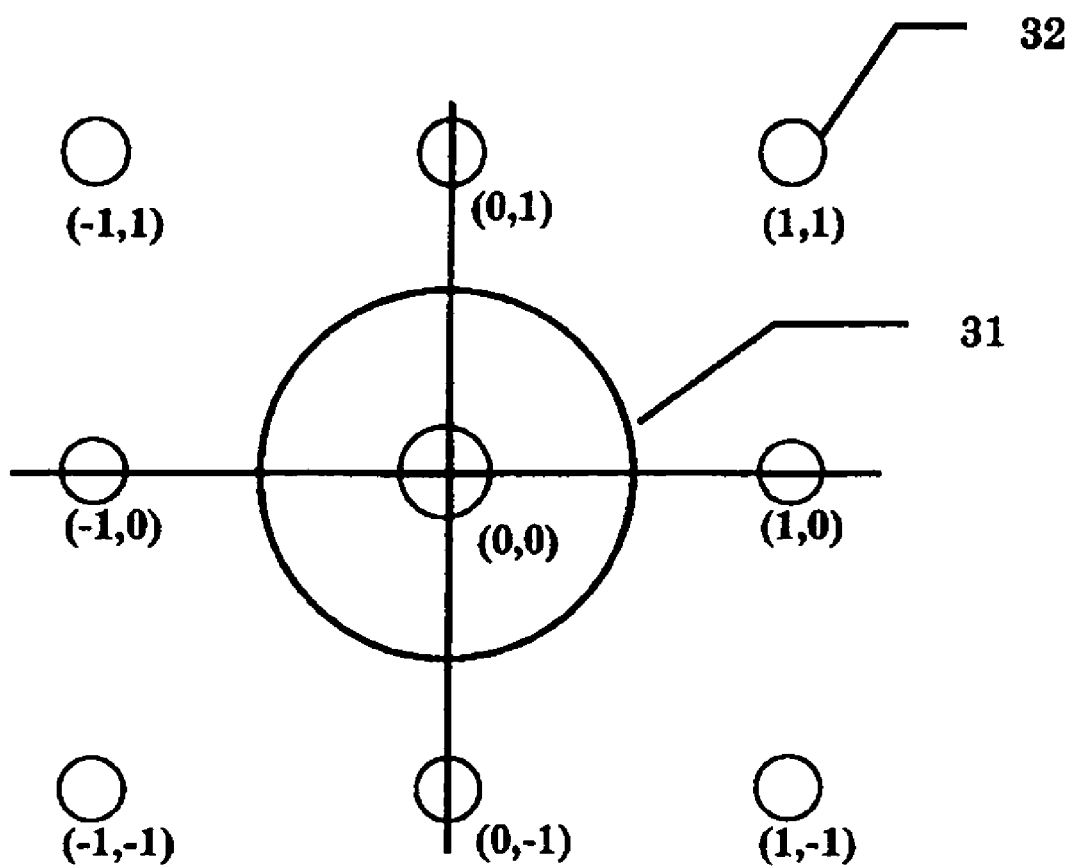
FIG. 3 is a schematic view showing a distribution of a diffracted light on a pupil plane provided by a matrix pattern when the mask shown in FIG. 2 is a binary mask or an attenuated phase shifting mask.

A description will now be given of exposure of the dense contact holes. The dense contact hole pattern is a pattern having crowded contact holes (with g<3, where a ratio is 1:g between a hole diameter and a hole interval). For example, as schematically shown in FIG. 2, the contact holes 21 are arranged at a period p in longitudinal and lateral directions. Assume that a mask is a binary mask or an attenuated phase shifting mask (or a half-tone mask). The binary mask is a mask having a light transmitting part and a light shielding part, which respectively correspond to 21 and 24 in FIG. 2. The attenuated phase shifting mask is a mask that replaces the light shielding part of the binary mask with a light attenuating part, and provides a phase difference of about 180° to the light transmitting part. In FIG. 2, the light transmitting part corresponds to 21, and the light attenuating part corresponds to 24. Although the attenuation of 4% to 25% of the light that has passed the light attenuating part is sufficient for the light passes the light transmitting part, the recent trend is to set a high transmittance. For a pattern extending in the longitudinal and lateral directions, diffracted lights 32 appear like a grid, as shown in FIG. 3, on the pupil plane in accordance with the pattern period. The diffracted light that appears at the center of the pupil 31 is referred to as a (0, 0)-th order diffracted light. A (n, m)-th diffracted light is defined as a diffracted light that appears at the n-th position in the x direction and at the m-th position in the y direction, where n and m are integers. Depending upon the mask type and pattern arrangement, other diffracted lights may occur between the (n, m)-th diffracted light and the (n, m±1)-th diffracted lights. The diffracted lights will be referred to as (n, m±½)-th diffracted lights in this specification. Similarly, diffracted lights that may occur among the (n, m)-th diffracted light and the (n±1, m)-th diffracted lights will be referred to as (n±½, m)-th diffracted lights.

Figure 4A:
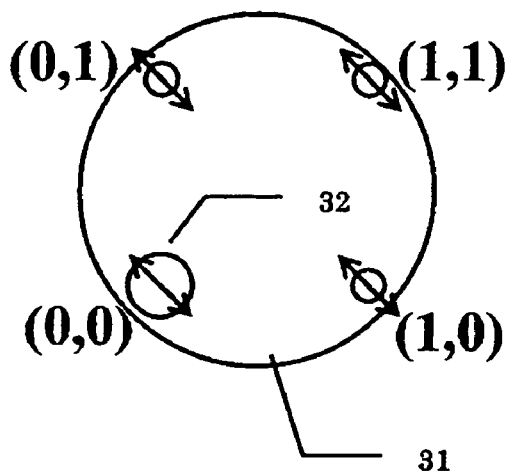
FIGS. 4A and 4B are schematic views of a distribution of diffracted lights on the pupil plane when the mask shown in FIG. 2 is a binary mask or an attenuated phase shifting mask, a period of the dense contact hole pattern is large, and the mask is illuminated by different polarized illumination states.
Figure 4B:
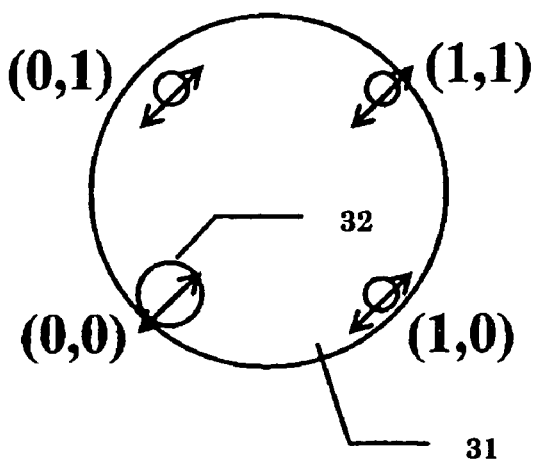

When the maximum $\sigma$ is one in the exposure apparatus, and a k1 converted half pitch that is directed to half of a period p of the dense contact hole pattern is greater than $0.25 \times \sqrt{2}$, four or more diffracted lights can be incident upon the pupil. Given an off-axis illumination that is polarized in the tangential direction (or tangentially polarized illumination), the diffracted light distribution and the polarization state on the pupil plane are, for example, as shown in FIG. 4A. In other words, four types of diffracted lights, such as the (0, 0)-th order diffracted light, the (1, 0)-th order diffracted light, the (0, 1)-th order diffracted light, and the (1, 1)-th order diffracted light are incident upon the pupil 31, and these diffracted lights have polarization directions as indicated by arrows in FIG. 4A. When the polarization and the interference are weighed, the (0, 0)-th order diffracted light and the (1, 1)-th order diffracted light interfere with each other, whereas the (1, 0)-th order diffracted light and the (0, 1)-th order diffracted light are less likely to interfere with each other. On the other hand, given an off-axis illumination that is polarized in the radial direction (or radially polarized illumination), the diffracted light distribution and the polarization state on the pupil plane 31 are as shown in FIG. 4B. The (1, 0)-th order diffracted light and the (0, 1)-th order diffracted light interfere with each other, whereas the (0, 0)-th order diffracted light and the (1, 1)-th order diffracted light are less likely to interfere with each other. In conclusion, the (0, 0)-th order diffracted light significantly affects imaging for the off-axis illumination that is polarized in the tangential direction, but does not for the off-axis illumination that is polarized in the radial direction.

Taking the above interference principle into account, it is predicted that there is hardly any disparity between the polarized illumination in the tangential direction (i.e., illumination that uses a tangentially polarized light) and the polarized illumination in the radial direction (i.e., illumination that uses a radially polarized light), when the binary mask is illuminated by the off-axis illumination by making the k1 converted half pitch of the dense contact hole pattern greater than $0.25\times\sqrt{2}$. Since an intensity difference is large between the (0, 0)-th order diffracted light and the (1, 1)-th order diffracted light, the contrast by the polarized illumination in the tangential direction becomes slightly worse.

On the other hand, the polarized illumination in the radial direction provides better imaging performance than the polarized illumination in the tangential direction, when the attenuated phase shifting mask is illuminated by the off-axis illumination and the k1 converted half pitch of the dense contact hole pattern is made greater than $0.25\times\sqrt{2}$. This is because an intensity of the (0, 0)-th order diffracted light is significantly weakened.

Assume that the mask is a Levenson type phase shifting mask (or an alternating-PSM) and the k1 converted half pitch of the dense contact hole pattern is made greater than $0.25\times\sqrt{2}$. The alternating-PSM is a mask that has a phase difference of 180° between adjacent light transmitting parts both in the longitudinal and lateral directions. In this case, the (½, ½)-th diffracted light, the (−½, ½)-th diffracted light, the (½, −½)-th diffracted light, the (−½, −½)-th diffracted light are always incident upon the pupil. Since these diffracted lights have the same intensity, there is no disparity between the imaging performance with the polarized illumination in the tangential direction and that in the radial direction. Therefore, it is unnecessary to use a polarized illumination.

Assume that the maximum σ is one in the exposure apparatus and the k1 converted half pitch of the dense contact hole pattern is made $0.25\times\sqrt{2}$ or smaller. In this case, it is physically impossible that four or more diffracted lights are incident upon the pupil. Basically, only two types of diffracted lights are incident upon the pupil.

Figure 5A:
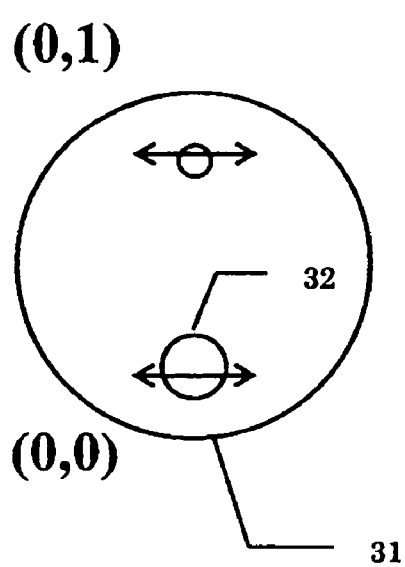
FIGS. 5A and 5B are schematic views of a distribution of diffracted lights on the pupil plane when the mask shown in FIG. 2 is a binary mask or an attenuated phase shifting mask, a period of the dense contact hole pattern is small, and the mask is illuminated by different polarized illuminations.
Figure 5B:
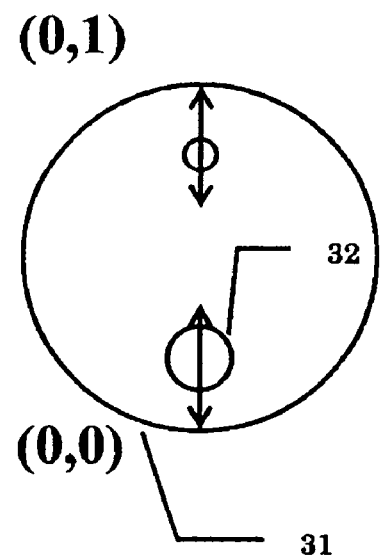

When the k1 converted half pitch of the dense contact hole pattern is $0.25\times\sqrt{2}$ or smaller and the binary mask or attenuated phase shifting mask is illuminated by the off-axis illumination in the tangential direction, the diffracted light distribution and the polarization state are obtained on the pupil plane, for example, as shown in FIG. 5A. In this case, the (0, 0)-th order diffracted light and the (0, 1)-th order diffracted light sufficiently interfere with each other. Given the polarized illumination in the radial direction, the diffracted light distribution and the polarization state are obtained on the pupil plane as shown in FIG. 5B, and the (0, 0)-th order diffracted light and the (0, 1)-th order diffracted light are unlikely to interfere with each other. In conclusion, the polarized illumination in the tangential direction is suitable for the binary or attenuated phase shifting mask when the k1 converted half pitch of the dense contact hole pattern is made $0.25\times\sqrt{2}$ or smaller.

Figure 6A:
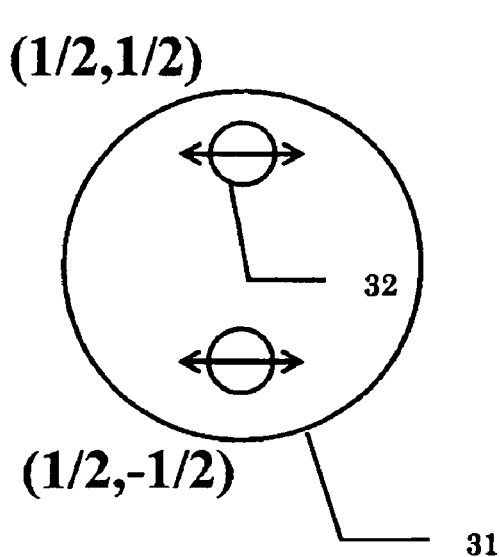
FIGS. 6A and 6B are schematic views of a distribution of diffracted lights on the pupil plane when the mask shown in FIG. 2 is an alternative phase shifting mask, a period of the dense contact hole pattern is small, and the mask is illuminated by different polarized illuminations.
Figure 6B:
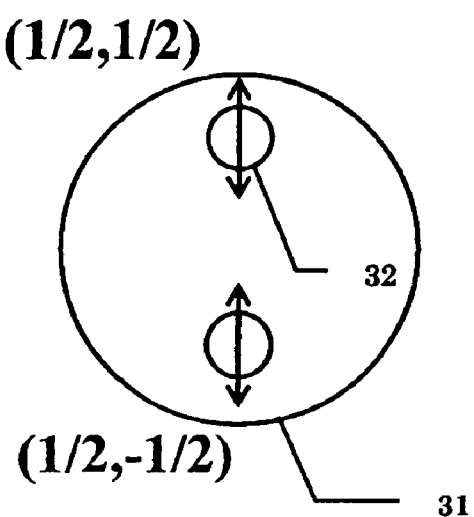

When the alternating-PSM is illuminated by the off-axis illumination in the radial direction while the k1 converted half pitch of the dense contact hole pattern is made $0.25\times\sqrt{2}$ or smaller, the diffracted light distribution and the polarization state are obtained on the pupil plane, for example, as shown in FIG. 6A, and the light intensity distribution on the image plane has contrast enough for resolution. On the other hand, given the polarized illumination in the tangential direction, the diffracted light distribution and the polarization state are obtained on the pupil plane, for example, as shown in FIG. 6B, and the light intensity distribution on the image plane runs short of contrast for resolution. In conclusion, the polarized illumination in the radial direction is suitable for the alternating-PSM when the k1 converted half pitch of the dense contact hole pattern is made $0.25\times\sqrt{2}$ or smaller.

Figure 7:
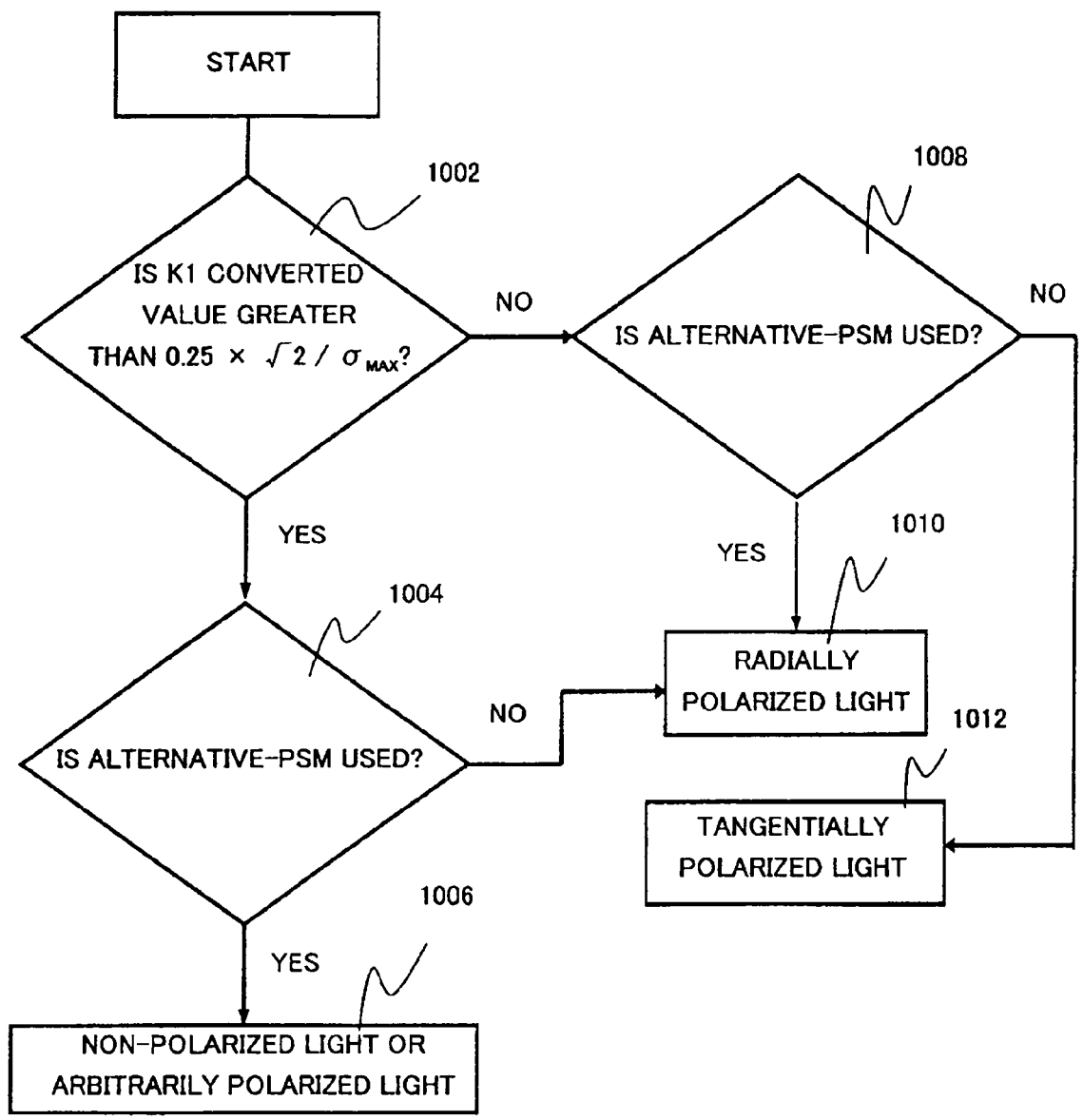
FIG. 7 is a flowchart for explaining setting of a polarization state in the exposure method according to one aspect of the present invention.

In summary, an illumination condition for a dense contact hole pattern should follow a flowchart shown in FIG. 7. In FIG. 7, $\sigma_{max}$ is a maximum σ available in an exposure apparatus, but one when the maximum σ is 1 or greater.

As illustrated, it is first determined whether a k1 converted value is greater than $0.25\times\sqrt{2}/\sigma_{max}$ (step 1002). When step 1002 determines that it is greater, then it is determined whether an alternating-PSM is to be used (step 1004). When step 1004 determines that the alternating-PSM is to be used, an unpolarized illumination or an arbitrary polarized illumination is used (step 1006). On the other hand, when step 1002 determines that the k1 converted value is $0.25\times\sqrt{2}/\sigma_{max}$ or smaller, then it is determined whether an alternating-PSM is to be used (step 1008). When step 1004 determines that the alternating-PSM is not to be used or when step 1008 determines that the alternating-PSM is to be used, a polarized illumination in the radial direction is used (step 1010). On the other hand, when step 1008 determines that the alternating-PSM is not to be used, a polarized illumination in the tangential direction is used (step 1012).

When a period in a longitudinal direction differs from that in a lateral direction, the flowchart shown in FIG. 7 may be applied by utilizing a k1 converted value of a smaller period. This is because the smaller the period is, the more influential the polarization is. The "period," as used herein, is a period of a dense contact hole pattern in the mask shown in FIG. 2, and a period of a pattern that includes both a desired pattern and an auxiliary or dummy pattern in masks shown in FIGS. 10B and 10D, as described later. In an attempt to more strictly apply the flowchart shown in FIG. 7 when the period differs between the longitudinal direction and the lateral direction, it is necessary to separately consider the cases where an addition of an inverse of a square of a k1 converted value in the longitudinal direction and an inverse of a square of a k1 converted value in the lateral direction is greater than sixteen or the addition is sixteen or smaller. In other words, step 1002 is preferably changed to "is the addition of an inverse of a square of a k1 converted value in the longitudinal direction and an inverse of a square of a k1 converted value in the lateral direction greater than 16" in the flowchart shown in FIG. 7.

First Embodiment

Figure 8A:
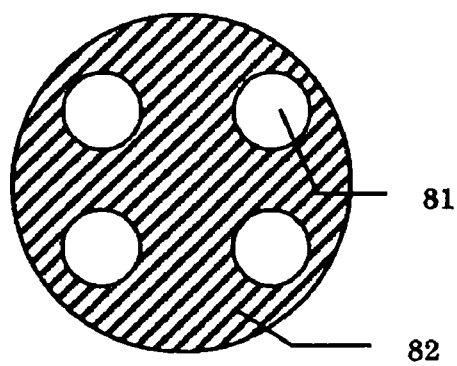
FIGS. 8A to 8E are schematic plan views of an effective light source shape applicable to the exposure apparatus shown in FIG. 1.

Assume that an exposure apparatus uses the exposure light having a wavelength of about 193 nm, has a projection optical system with an NA of 0.92, and sets the maximum σ to one. For a dense contact hole pattern having a hole diameter of 85 nm and a hole interval of 85 nm, an effective light source shape is set to a quadrupole illumination that has four light irradiating (or bright) parts at ±45° directions with respect to a horizontal direction (a periodic direction of the pattern) as shown in FIG. 8A. A center of each light irradiating part 81 is distant by 0.85 from the center of the effective light source shape when converted into σ. Each light irradiating part 81 has a diameter of 0.20 when converted into σ.

Figure 9A:
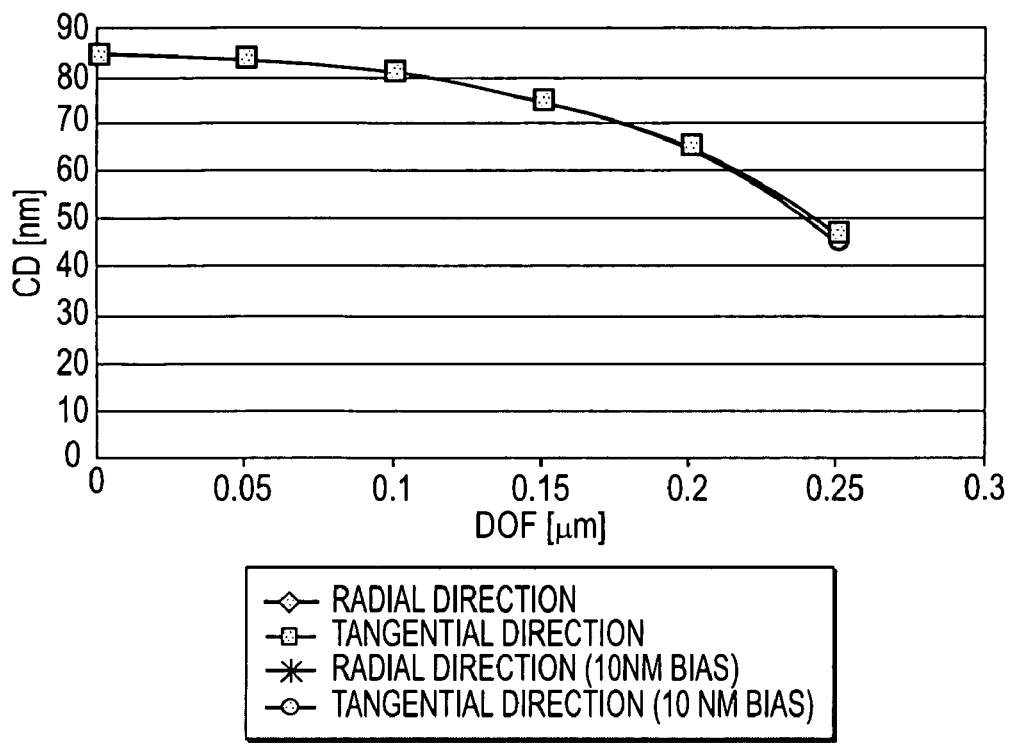
FIGS. 9A and 9B are graphs for explaining an effect of the method shown in FIG. 7.

FIG. 9A shows a relationship between a defocus amount and a hole diameter or critical dimension ("CD") when the mask is a binary mask. In FIG. 9A, under "10 nm bias," the hole diameter is adjusted to 95 nm and the hole interval is adjusted to 75 nm, but the exposed hole diameter becomes 85 nm by adjusting the slice level of the light intensity distribution on the image plane. As described above, it was discovered for the binary mask, there is hardly a disparity between the defocus characteristic with the tangentially polarized light and that with the radially polarized light, and the radially polarized light provides a slightly better characteristic.

Figure 9B:
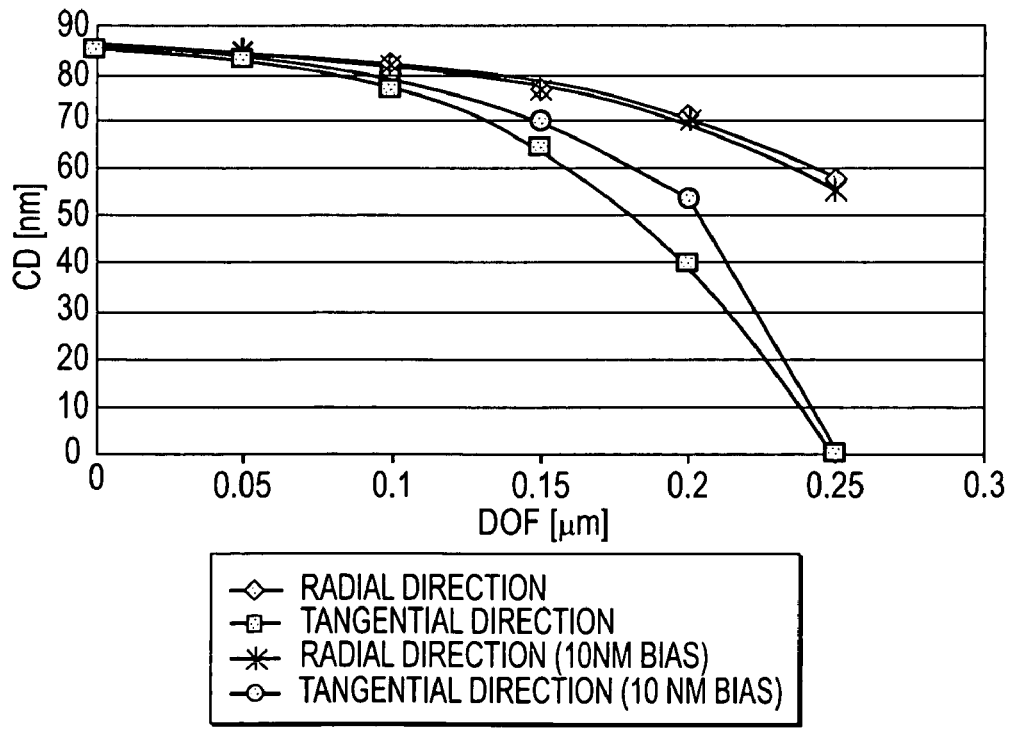

FIG. 9B shows a defocus characteristic when the mask is an attenuated phase shifting mask that has a light attenuating part with an intensity transmittance of 6%. As described above, the radially polarized light shows a better focus characteristic than the tangentially polarized light.

In FIGS. 9A and 9B, there is hardly any disparity between the imaging performance with the 10 nm bias and that without the 10 nm bias. However, actually, the imaging performance with the 10 nm bias is advantageous in throughput because a higher light intensity is available on the image plane.

Figure 8B:
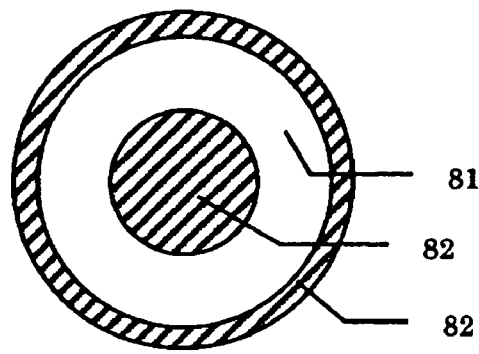
Figure 8C:
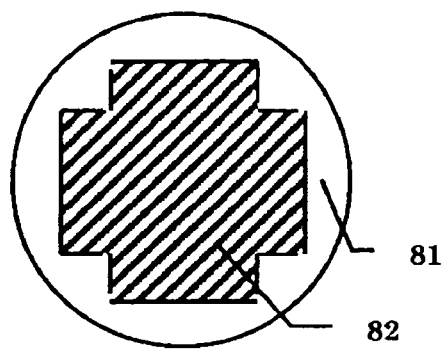
Figure 8D:
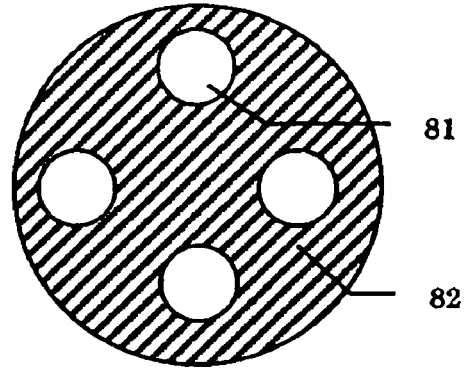
Figure 8E:
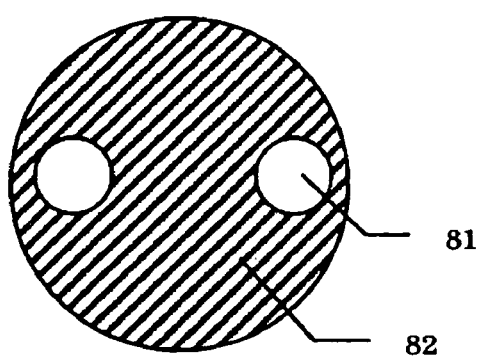

This embodiment proves the effectiveness of the flowchart of FIG. 7. While this embodiment uses a quadrupole illumination shown in FIG. 8A for the effective light source shape, a basically preferable effective light source is one that has a dark central part. For example, the principle of this embodiment is true of exposure of a contact hole pattern with, for example, an annular illumination shown in FIG. 8B, and an illumination shown in FIG. 8C having, at the center, a cross light shielding or a dark part that extends in the pattern's periodic direction and a direction perpendicular to the periodic direction. Similarly, the principle of this embodiment is true of a cross-quadrupole illumination shown in FIG. 8D that has light irradiating parts in 0° and 90° directions with respect to the horizontal direction (or pattern's periodic direction), and a dipole illumination shown in FIG. 8E that has two light irradiating parts.

It is premised that both the quadrupole illumination and the cross-quadrupole illumination have four isolated light irradiating parts, and a shape of the light irradiating part is not limited. For example, the quadrupole illumination and the cross-quadrupole illumination may be an effective light source that is formed by cutting four sections from the annular illumination from a center of the effective light source with a spread angle. Similarly, it is premised that the dipole illumination has two isolated light irradiating parts, and a shape of the light irradiating part is not limited.

Second Embodiment

The polarized illumination suitable for the dense contact hole pattern has been discussed with respect to the mask type and the half pitch size. An actual contact hole mask has not only a dense contact hole pattern but also an isolated contact hole pattern. Usually, the isolated contact hole is so optically sufficiently isolated that a ratio between the hole diameter and the hole interval is 1:7 or greater. However, in a broad sense, it is isolated when the interval is such that the adjacent two holes do not affect each other and strictly speaking the ratio depends upon the effective light source shape. Therefore, a ratio between the hole diameter and the hole interval is 1:5 or greater may be entitled to the isolation. Since the range is defined as up to 1:3, this specification refers to the ratio between the hole diameter and the hole interval from 1:3 to 1:7 as an intermediate period. According to the conventional practice, a small a illumination is suitable for the isolated contact hole and the off-axis illumination is suitable for the dense contact hole pattern. It is understood from this practice that a suitable illumination condition is different between the isolated contact hole and the dense contact hole pattern. This is because as the hole diameter reduces, the diffracted light of the isolated contact hole exhibits such a symmetrical distribution with respect to the center on the pupil plane that the intensity smoothly lowers at the pupil periphery in comparison with the pupil center, completely different from the diffracted light distribution of the dense contact hole pattern. It is intuitively difficult to understand the influence of the polarization on the isolated contact hole, and the solution of the polarized illumination to the isolated contact hole has not yet been proposed.

On the other hand, it is a known approach to insert an auxiliary or dummy pattern around the isolated contact hole pattern on the mask in exposing the isolated contact hole pattern. See, for example, Japanese Patent Application, Publication No. 2003-234285. It is known that the auxiliary pattern works under the optical proximity correction ("OPC") effect the auxiliary pattern improves the imaging performance of the desired pattern.

This inventor discovered that when the auxiliary pattern that is too small to resolve is inserted around the isolated contact hole, the diffracted light distribution on the pupil plane is similar to the diffracted light distribution of the dense contact hole pattern. As described with reference to the flowchart shown in FIG. 7, the suitable polarized illumination can be led from the diffracted light distribution of the dense contact hole pattern.

Figure 10A:
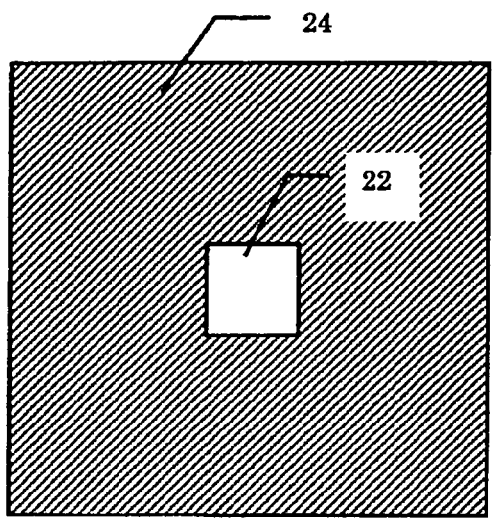
FIGS. 10A to 10D are a schematic view of contact hole patterns applicable to the mask shown in FIG. 1.
Figure 10B:
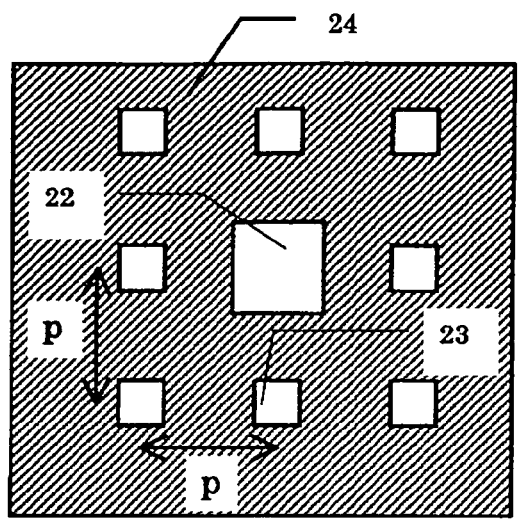

For example, given the isolated contact hole 22 shown in FIG. 10A, the auxiliary pattern 23 is arranged around the isolated contact hole 22 as shown in FIG. 10B. Preferably, the interval between centers of the auxiliary pattern and the desired pattern (isolated contact hole) is set to 1.8 times to 2.2 times as large as the desired hole diameter (or the hole diameter of the contact hole). Also, preferably, the size of the auxiliary pattern is between 50% and 90% of the desired pattern. When the image performance with the auxiliary pattern is compared with the image performance without the auxiliary pattern, the image performance with the auxiliary pattern is better. Therefore, the effect of the auxiliary pattern is maintained even when the auxiliary pattern beyond the above preferable ranges is used. The flowchart shown in FIG. 7 is used where p is set to the interval between centers of the auxiliary pattern and the desired pattern and the half pitch is k1-converted.

Figure 11A:
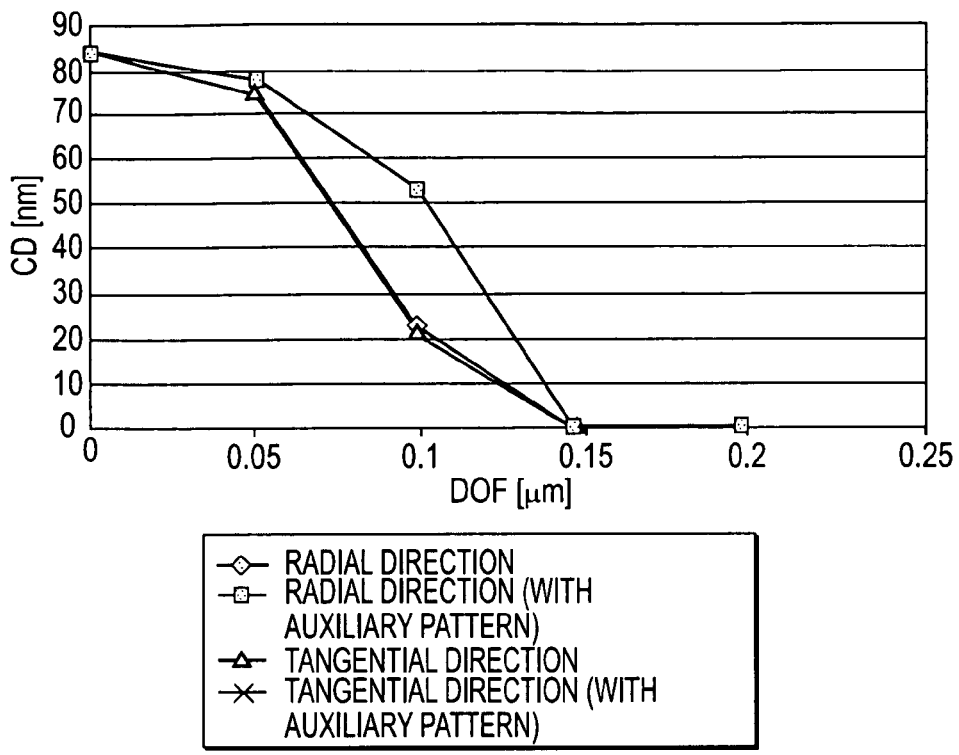
FIGS. 11A and 11B are graphs for explaining an effect of the method shown in FIG. 7.

For example, assume the wavelength of the exposure light is 193 nm, the NA of the projection optical system is 0.92, and the maximum (i is 1. The effective light source shape is a quadrupole illumination, as shown in FIG. 8A, which has four light irradiating parts that extend in ±45° directions with respect to the horizontal direction. A center of each light irradiating part 81 is distant by 0.85 from the center of the effective light source shape when converted into σ. Each light irradiating part 81 has a diameter of 0.20 when converted into σ. Assume that the binary mask has a desired pattern hole diameter of 85 nm in FIG. 10A. FIG. 11A shows focus characteristics for the tangentially polarized light and the radially polarized light, where the desired pattern hole diameter is 85 nm, the auxiliary pattern hole diameter of 60 nm, and p is 170 nm in FIG. 10B. The focus characteristic with the auxiliary pattern is better than that without the auxiliary pattern. The radially polarized light provides a slightly better focus characteristic whether the auxiliary pattern is inserted or not.

Figure 11B:
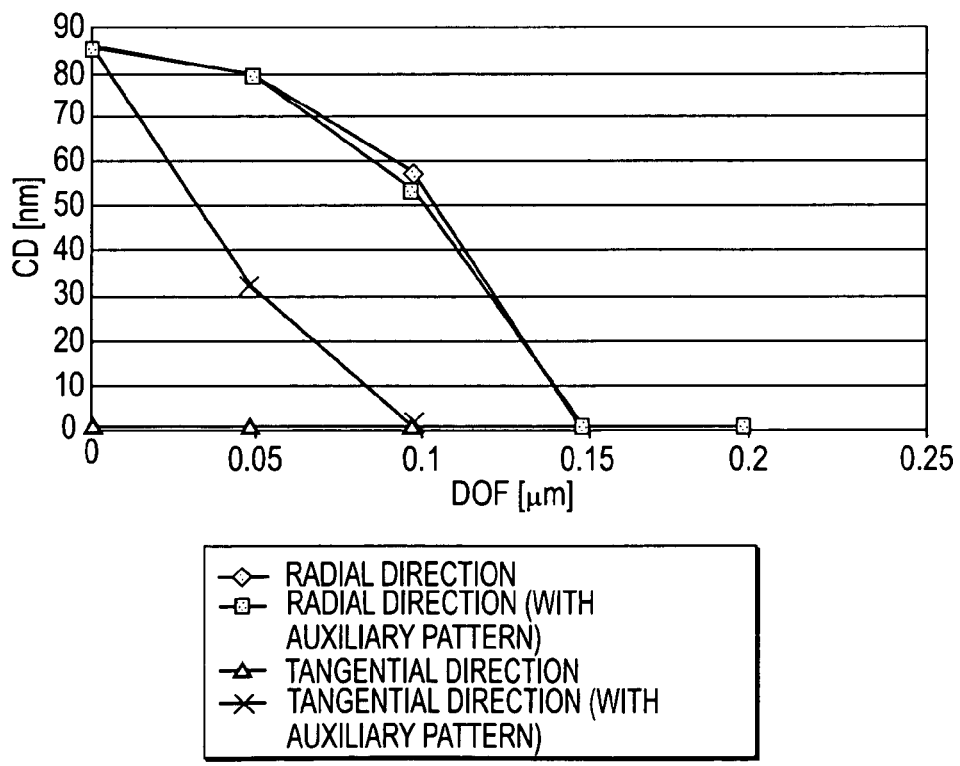

Similar focus characteristics are studied for the attenuated phase shifting mask having the light attenuating part with an intensity transmittance of 6%, and a result is obtained as shown in FIG. 11B. In leading the result shown in FIG. 11B, the desired pattern is provided with a 10 nm bias. For the polarized illumination in the tangential direction, the focus characteristic with the auxiliary pattern is better. On the other hand, for the polarized illumination in the radial direction, the focus characteristic does not change greatly whether the auxiliary pattern is inserted or not, although the auxiliary pattern improves the throughput because a higher light intensity reaches image plane.

In summary, the flowchart shown in FIG. 7 is applicable once the auxiliary pattern is inserted around the isolated contact hole and the k1-converted interval between centers of the desired pattern and the auxiliary pattern is used. Thus, the same polarized illumination is applicable to a mask that includes both dense contact holes and an isolated contact hole.

When an auxiliary pattern is inserted around an isolated contact hole and the same mask further includes dense contact holes, a period of the auxiliary pattern may be made equal to or different from that of the dense contact holes. When the period of the auxiliary pattern is different from that of the dense contact holes, a value used in step 1002 in FIG. 7 preferably uses a smaller period.

When the auxiliary pattern is not inserted around the isolated contact hole, the polarized illumination in the radial direction may be used in view of the result of FIG. 11. When the auxiliary pattern is not inserted around the isolated contact hole and the same mask includes the dense contact holes, the mask type is determined in accordance with the flowchart shown in FIG. 7 so that the polarization optimal to the dense contact holes is the radially polarized light.

Figure 10C:
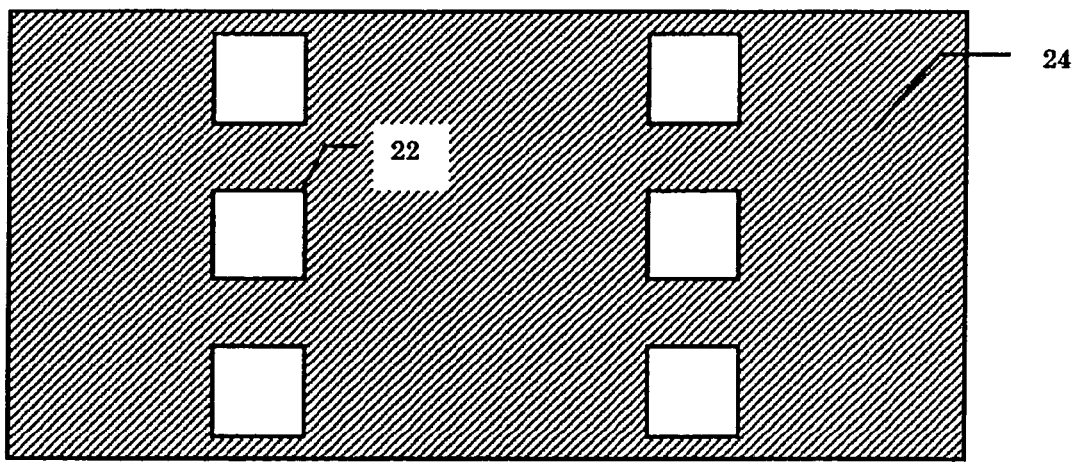

Next follows a study of a polarized illumination applied to a semi-dense contact hole pattern having an intermediate period. For example, assume the semi-dense contact hole pattern having an intermediate period in the lateral direction while it has a crowded pattern in the longitudinal direction as shown in FIG. 10C. In this case, given an auxiliary pattern that has an unsolved size between contact holes of the intermediate period, the diffracted lights appear as if they appear in the dense contact hole pattern and thus the flowchart shown in FIG. 7 is applied.

Figure 10D:
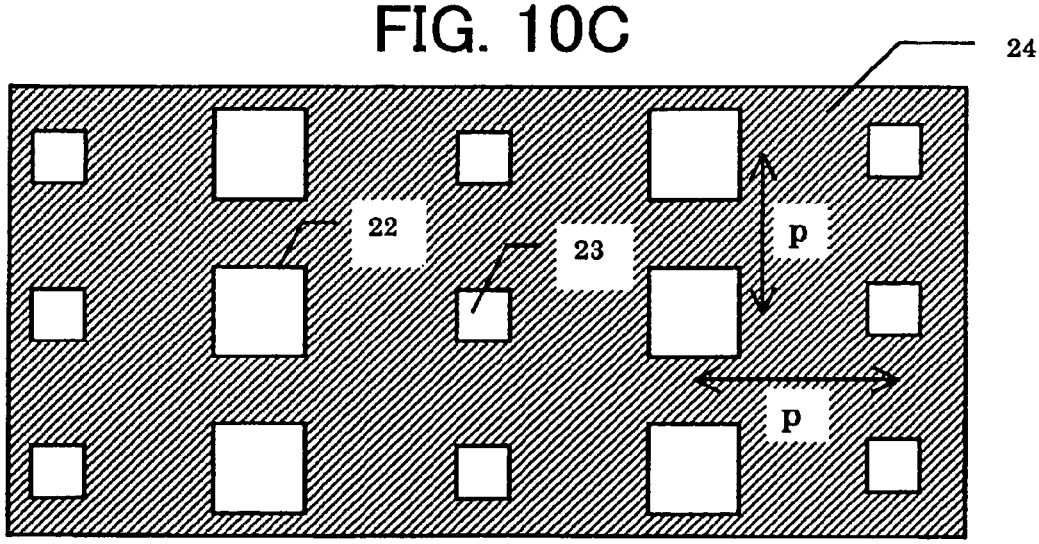

FIG. 10D is a mask that includes the auxiliary pattern in the mask shown in FIG. 10C. The flowchart shown in FIG. 7 is applied in accordance with the period p in FIG. 10D.

The discussion regarding FIG. 8 of the first embodiment is true of this embodiment.

Third Embodiment

Figure 1:
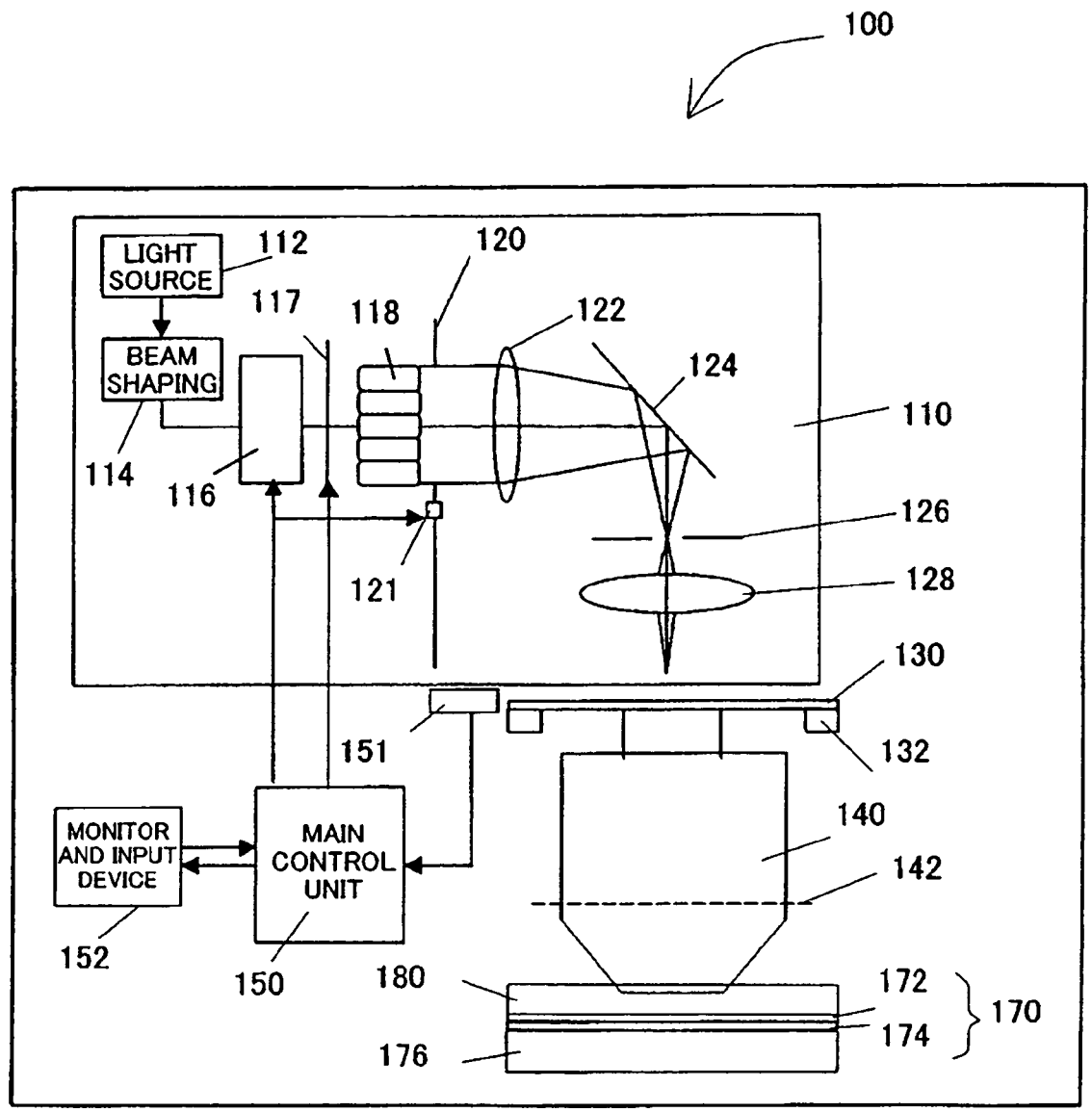
FIG. 1 is a schematic block diagram of an exposure apparatus according to one aspect of the present invention.

A description will now be given of an exposure apparatus 100 of one embodiment according to the present invention with reference to FIG. 1. Here, FIG. 1 is a schematic block diagram of the exposure apparatus 100. As shown in FIG. 1, the exposure apparatus includes an illumination unit 110, a mask 130, a mask stage 132, a projection optical system 140, a main control unit 150, a monitor and input device 150, a wafer 170, a wafer stage 176, and a liquid 180 as a medium. Thus, the exposure apparatus 100 is an immersion exposure apparatus that immerses a space between the final surface of the projection optical system 140 and the wafer 170 in the liquid 180, and exposes the mask patterns onto the wafer 170 via the liquid 180. Although the exposure apparatus 100 of the instant embodiment is a step-and-scan manner projection exposure apparatus (or a scanner), the present invention is applicable to a step-and-repeat manner and other exposure methods.

The illumination apparatus 110 illuminates the mask 130 that has a circuit pattern to be transferred, and includes a light source section and an illumination optical system.

The light source section includes laser 112 as a light source, and a beam shaping system 114. The laser 112 may be a pulsed laser such as an ArF excimer laser with a wavelength of approximately 193 nm, a KrF excimer laser with a wavelength of approximately 248 nm, an $F_2$ laser with a wavelength of approximately 157 nm, etc. A kind of laser, the number of laser units, and a type of light source section is not limited.

The beam shaping system 114 can use, for example, a beam expander, etc., with a plurality of cylindrical lenses, and convert an aspect ratio of the size of the sectional shape of a parallel beam from the laser 112 into a desired value (for example, by changing the sectional shape from a rectangle to a square), thus reshaping the beam shape to a desired one. The beam shaping system 114 forms a beam that has a size and a divergent angle necessary for illuminating an optical integrator 118 described later.

The illumination optical system is an optical system that illuminates the mask 130, and includes a condensing optical system 116, a polarization control part 117, an optical integrator 118, an aperture stop 120, a condenser lens 122, a deflecting mirror 124, a masking blade 126, and an imaging lens 128 in this embodiment. The illumination optical system 120 can realize various illumination modes, such as conventional illumination, annular illumination, quadrupole illumination, etc.

The condensing optical system 116 includes plural optical elements, and efficiently introduces a beam with the desired shape into the optical integrator 118. In some cases, the condensing optical system 116 involves a zoom lens system to control the shape and angular distribution of the incident beam to the optical integrator 118.

The condensing optical system 116 further includes an exposure dose regulator that can change an exposure dose of illumination light for the mask 130 per illumination. The exposure dose regulator is controlled by the main control unit 150. An exposure dose monitor may be placed between the fly-eye lens 118 and the reticle 130 or another place to measure the exposure dose, and the measurement result may be fed back.

A polarization control part 117 includes, for example, a polarization element at an approximately conjugate to a pupil 142 of the projection optical system 140. The polarization control part 117 controls, as described with reference to FIGS. 4A to 6B, a polarization state in a predetermined region in an effective light source formed on the pupil 142. The polarization control part 117 may include plural types of polarization elements that are provided on a turret rotatable by an actuator (not shown), and the main control unit 150 may control driving of the actuator.

The optical integrator 118 makes uniform illumination light that illuminates the mask 130, and includes a fly-eye lens in the instant embodiment for converting an angular distribution of incident light into a positional distribution, thus exiting the light. The fly-eye lens is so maintained that its incident plane and its exit plane are maintained in the Fourier transformation relationship, and includes a multiplicity of rod lenses (or fine lens elements). However, the optical integrator 118 usable for the present invention is not limited to the fly-eye lens, and can include an optical rod, a diffraction grating, plural pairs of cylindrical lens array plates that are arranged so that these pairs are orthogonal to each other, a micro-lens array, etc.

Provided right after the exit plane of the optical integrator 118 is the aperture stop 120 that has a fixed shape and diameter. The aperture stop 120 is arranged at a position approximately conjugate to the effective light source on the pupil 142 of the projection optical system 140, as shown in FIGS. 8A to 8E, and the aperture shape of the aperture stop 120 corresponds to the effective light source shape on the pupil 142 surface in the projection optical system 140. The aperture shape of the aperture stop 120 defines a shape of the effective light source on the pupil 142 surface in the projection optical system 140.

Various aperture stops can be switched so that it is located on the optical path by a stop exchange mechanism (or actuator) 121 according to illumination conditions. A drive control unit 151 controlled by the main control unit 150 controls driving of the actuator 121. The aperture stop 120 may be integrated with the polarization control part 117.

The condenser lens 122 collects all the beams that have exited from a secondary light source near the exit plane of the optical integrator 118 and passed through the aperture stop 120. The beams are reflected by the mirror 124, and uniformly illuminate or Koehler-illuminate the masking blade 126 plane.

The masking blade 126 includes plural movable light shielding plates, and has an approximately rectangular opening shape corresponding to the effective area of the projection optical system 140. The light that has passed through the opening of the masking blade 126 is used as illumination light for the mask 130. The masking blade 126 is a stop having an automatically variable opening width, thus changing a transfer area. The exposure apparatus 100 may further include a scan blade, with a structure similar to the above masking blade 126, which varies the transfer area in the scanning direction. The scan blade is also a stop having an automatically variable opening width, and is placed at an optically approximately conjugate position to the plane of the mask 130. The exposure apparatus 100 uses these two variable blades to set the dimensions of the transfer area in accordance with the dimensions of an exposure shot.

The imaging lens 128 transfers an aperture shape of the masking blade 126 onto the mask 130 plane, and projects a reduced image of the mask 130 onto the wafer 170 plane installed on a wafer chuck (not shown).

The mask 130 has a circuit pattern or a pattern to be transferred, and is supported and driven by a mask stage 132. Diffracted light emitted from the mask 130 passes the projection optical system 140, and then is projected onto the wafer 170. The mask 130 and the wafer 170 are arranged in an optically conjugate relationship. The exposure apparatus in this embodiment is a scanner and, therefore, synchronously scans the mask 130 and the wafer 170 to transfer a pattern on the mask 130 onto the wafer 170. When it is a step-and-repeat type exposure apparatus (i.e., "stepper"), the mask 130 and the wafer 170 are kept stationary during exposure.

The mask stage 132 supports the mask 130, and is connected to a transport mechanism (not shown). The mask stage 132 and the projection optical system 140 are installed on a stage barrel stool supported via a damper, for example, to a base frame placed on the floor. The mask stage 132 can use any structure known in the art. The transport mechanism (not shown) is made of a linear motor, and the like, and drives the mask stage 132 in X-Y directions, thus moving the mask 130. The exposure apparatus 100 synchronously scans the mask 130 and the wafer 170 under control by the main control unit 150.

The projection optical system 140 serves to image the diffracted light that has been generated by the patterns of the mask 130 onto the wafer 170. The projection optical system 140 may use a dioptric optical system solely composed of a plurality of lens elements, a catadioptric optical system comprised of a plurality of lens elements and at least one concave mirror, etc.

The main control unit 150 controls driving of each component, and particularly controls the illuminator based on the information input into the input device of the monitor and input device 152, information from the illumination apparatus 110, and a program (flowchart shown in FIG. 7) stored in a memory (not shown). More specifically, the main control unit 150 identifies a mask type (such as a binary mask, an attenuated phase shifting mask, and an alternating-PSM) by reading a barcode adhered to the mask 130 and a period of a contact hole pattern. Then, in accordance with the flowchart shown in FIG. 7, the main control unit 150 controls the polarization control part 117, and sets a proper polarization state (i.e., a radial illumination, a tangential illumination and an unpolarized illumination, and another polarized illumination), and a shape of the effective light source formed on the pupil 142 of the projection optical system 140. Of course, an operator may directly input the information into the main control unit 150, or the operator can select and set the polarization state in accordance with the flowchart shown in FIG. 7. This is true of the effective light source shape. Control information and other information for the main control unit 150 are indicated on the display of the monitor and input device 152.

The wafer 170 is replaced with a liquid crystal plate and another object to be exposed in another embodiment. The photoresist 172 is coated on a substrate 174.

The wafer 170 is supported by a wafer stage 176. The stage 176 may use any structure known in the art, and thus, a detailed description of its structure and operations is omitted. For example, the stage 176 uses a linear motor to move the wafer 170 in X-Y directions. The mask 130 and wafer 170 are, for example, scanned synchronously, and the positions of the mask stage 132 and wafer stage 176 are monitored, for example, by a laser interferometer, and the like, so that both are driven at a constant speed ratio. The stage 176 is installed on a stage stool supported on the floor, and the like, for example, via a damper.

The liquid 180 selects its material that has good transmittance to the wavelength of the exposure light, does not contaminate the projection optical system 140, and matches the resist process. The coating protects the final surface of the projection optical system 140 from the liquid 180.

In exposure, a beam emitted from the laser 112 is reshaped into a desired beam shape by the beam shaping system 114. Then, the condensing optical system 116 guides the beams to the optical integrator 118. On the other hand, in accordance with the flowchart shown in FIG. 7, the main control unit 150 sets an aperture shape and a polarization state as an illumination condition suitable for the mask pattern by driving the actuator (not shown) of the polarization control part 117 and the actuator 112 of the aperture stop 120. The optical integrator 118 makes uniform the illumination light, and the aperture stop 120 sets an effective light source shape, as shown in FIGS. 8A to 8E. Such illumination light illuminates the mask 130 under the optimal condition through the condenser lens 122, the deflecting mirror 124, the masking blade 126 and imaging lens 128. Beams that have passed the mask 130 are projected under a specific magnification onto the wafer 170 by the projection optical system 140.

Since the final surface of the projection optical system 140 closest to the wafer 170 is immersed in the liquid 180 that has a higher refractive index than that of air, the projection optical system 140 has a higher NA, and a finer resolution is achieved on the wafer 170. In addition, the polarization control forms an image with higher contrast on the resist 172. As a result, the exposure apparatus 100 precisely transfers a pattern onto the resist, and provides high-quality devices (such as semiconductor devices, LCD devices, photographing devices (such as CCDs, etc.), thin film magnetic heads, and the like).

Fourth Embodiment

Figure 12:
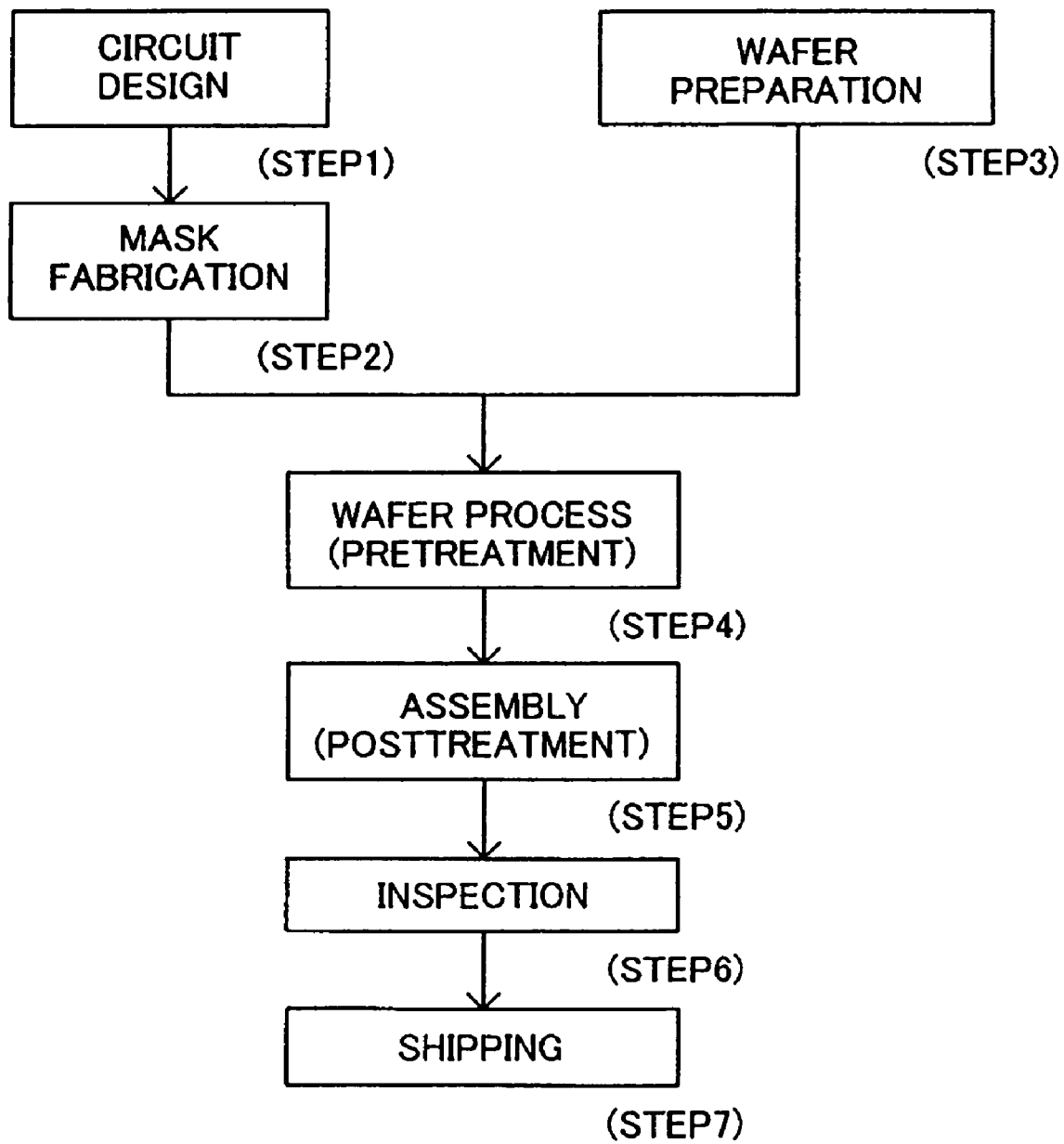
FIG. 12 is a flowchart for explaining the manufacture of devices (such as semiconductor chips such as ICs and LCDs, CCDs, and the like).
Figure 13:
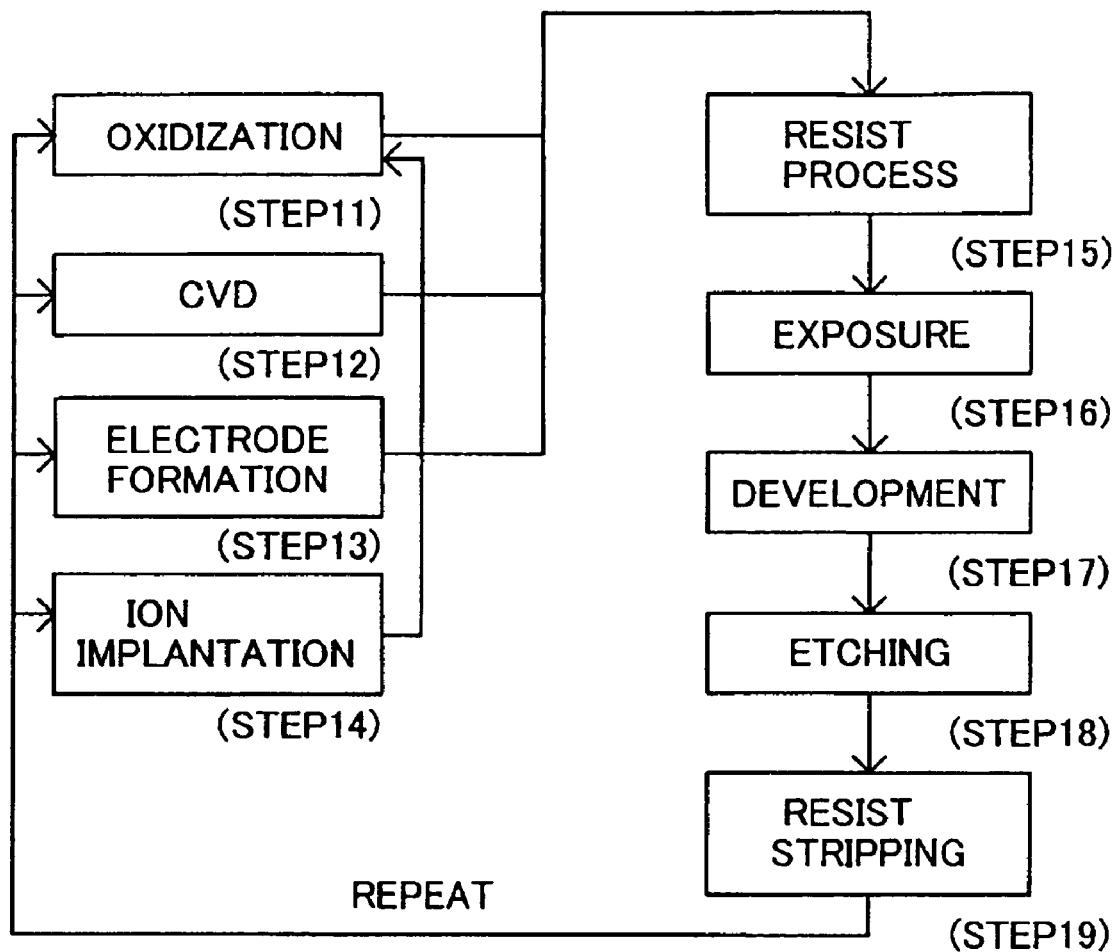
FIG. 13 is a detail flowchart of a wafer process as Step 4 shown in FIG. 12.

Referring to FIGS. 12 and 13, a description will now be given of an embodiment of a device manufacturing method using the above exposure apparatus 100. FIG. 12 is a flowchart for explaining a fabrication of devices (i.e., semiconductor chips such as ICs and LSIs, LCDs, CCDs, etc.). Here, a description will be given of a fabrication of a semiconductor chip as an example. Step 1 (circuit design) designs a semiconductor device circuit. Step 2 (mask fabrication) forms a mask having the designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 13 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition, and the like. Step 14 (ion implantation) implants ions into the wafer. Step 15 (resist process) applies a photosensitive material onto the wafer. Step 16 (exposure) uses the exposure apparatus 100 to expose a circuit pattern of the mask onto the wafer. Step 17 (development) develops the exposed wafer. Step 18 (etching) etches parts other than a developed resist image. Step 19 (resist stripping) removes unused resist after etching. These steps are repeated, and multilayer circuit patterns are formed on the wafer. The device manufacture method of the present invention may manufacture higher quality devices than does the conventional one.

Further, the present invention is not limited to these preferred embodiments, and various modifications and changes may be made in the present invention without departing from the spirit and scope thereof.

CLAIM OF PRIORITY

This application claims foreign priority benefit based on Japanese Patent Application No. 2005-056007, filed on Mar. 1, 2005, which is hereby incorporated by reference herein in its entirety as if fully set forth herein.

What is claimed is:

1. An exposure method for exposing an image of a mask pattern onto a plate via a projection optical system, said method comprising:

a step of illuminating one of a binary mask and an attenuated phase shifting mask, which comprises a contact hole pattern and an auxiliary pattern by utilizing light from a light source and an illumination optical system so that the contact hole pattern can be resolved, but a resolution of the auxiliary pattern is restrained, wherein said illuminating step uses off-axis illumination that is polarized in a tangential direction when a value that is calculated by normalizing half the length of an interval between centers of the auxiliary pattern and the contact hole pattern that are adjacent to each other by $\lambda/NA$ is $0.25 \times \sqrt{2}$ or less, where $\lambda$ is a wavelength of the light, and NA is a numerical aperture of the projection optical system at an image side.

2. An exposure apparatus comprising a mode for executing an exposure method according to claim 1.

3. A device manufacturing method comprising the steps of:

exposing a plate using an exposure apparatus according to claim 2; and developing the plate that has been exposed.

4. An exposure method for exposing an image of a mask pattern onto a plate via a projection optical system, said method comprising:

a step of illuminating one of a binary mask and an attenuated phase shifting mask, which comprises plural contact hole patterns and an auxiliary pattern by utilizing light from a light source and an illumination optical system so that the plural contact hole patterns can be resolved, but a resolution of the auxiliary pattern is restrained, wherein said illuminating step uses off-axis illumination that is polarized in a tangential direction when a value that is calculated by normalizing half the length of a smaller one of an interval between centers of the auxiliary pattern and the contact hole pattern that are adjacent to each other and an interval between centers of the contact hole patterns that are adjacent to each other by $\lambda/NA$ is $0.25 \times \sqrt{2}$ or less, where $\lambda$ is a wavelength of the light, and NA is a numerical aperture of the projection optical system at an image side.

5. An exposure apparatus comprising a mode for executing an exposure method according to claim 4.

6. A device manufacturing method comprising the steps of:
- exposing a plate using an exposure apparatus according to claim 5; and
- developing the plate that has been exposed.

7. An exposure method for exposing an image of a mask pattern onto a plate via a projection optical system, said method comprising:
- a step of illuminating one of a binary mask and an attenuated phase shifting mask, which comprises a plural contact hole pattern and an auxiliary pattern by utilizing light from a light source and an illumination optical system so that the plural contact hole patterns can be resolved, but a resolution of the auxiliary pattern is restrained,
- wherein said illuminating step uses off-axis illumination that is polarized in a radial direction when a value that is calculated by normalizing half the length of a smaller one of an interval between centers of the auxiliary pattern and the contact hole pattern that are adjacent to each other and an interval between centers of the contact hole patterns that are adjacent to each other by $\lambda/NA$ is greater than $0.25 \times \sqrt{2}$, where $\lambda$ is a wavelength of the light, and NA is a numerical aperture of the projection optical system at an image side.

8. An exposure apparatus comprising a mode for executing an exposure method according to claim 7.

9. A device manufacturing method comprising the steps of:
- exposing a plate using an exposure apparatus according to claim 8; and
- developing the plate that has been exposed.

10. An exposure method for exposing an image of a mask pattern onto a plate via a projection optical system, said method comprising:
- a step of illuminating one of a binary mask and an attenuated phase shifting mask, which comprises a contact hole pattern and an auxiliary pattern by utilizing light from a light source and an illumination optical system so that the contact hole pattern can be resolved, but a resolution of the auxiliary pattern is restrained,
- wherein said illuminating step uses off-axis illumination that is polarized in a radial direction when a value that is calculated by normalizing half the length of an interval between centers of the auxiliary pattern and the contact hole pattern that are adjacent to each other by $\lambda/NA$ is greater than $0.25 \times \sqrt{2}$, where $\lambda$ is a wavelength of the light, and NA is a numerical aperture of the projection optical system at an image side.

11. An exposure apparatus comprising a mode for executing an exposure method according to claim 10.

12. A device manufacturing method comprising the steps of:
- exposing a plate using an exposure apparatus according to claim 11; and
- developing the plate that has been exposed.

\* \* \* \* \*

UNITED STATES PATENT AND TRADEMARK OFFICE
CERTIFICATE OF CORRECTION

PATENT NO. : 7,359,033 B2
APPLICATION NO. : 11/363038
DATED : April 15, 2008
INVENTOR(S) : Kenji Yamazoe It is certified that error appears in the above-identified patent and that said Letters Patent is hereby corrected as shown below:

ON THE COVER PAGE:
In item "(56) References Cited," on "Page 2," in the second column, under "OTHER PUBLICATIONS," in the last-listed document, "Smith, Bruce, et al. "Challenges in high NA, polarization, and photoresists," Optical Microlithogrpahy XV, Proceedings of SPIE, vol. 4691 (2002), pp. 11-24." should read as follows:

-- Smith, Bruce, et al. "Challenges in high NA, polarization, and photoresists," *Optical Microlithography XV*, Proceedings of SPIE, vol. 4691 (2002), pp. 11-24. --.

COLUMN 4:
Line 47, "light passes" should read -- light passing through --.

COLUMN 8:
Line 18, "interval" should read -- interval that --.
Line 23, "small a" should read -- small σ --.
Line 45, "effect" should read -- effect and that --.

COLUMN 9:
Line 7, "maximum (i" should read -- maximum σ --.
Line 18, "of" should read -- is --.
Line 27, "leading" should read -- reading --.
Line 35, "reaches" should read -- reaches the --.
Line 67, following "applied.", the right margin should be closed up.

COLUMN 10:
Line 1, before "FIG. 10D," the left margin should be closed up.
Line 15, "device 150," should read -- device 152, --.

COLUMN 11:
Line 1, "fly-eye lens 118" should read -- optical integrator 118 --.
Line 5, "conjugate" should read -- conjugate position --.

UNITED STATES PATENT AND TRADEMARK OFFICE
CERTIFICATE OF CORRECTION

PATENT NO. : 7,359,033 B2
APPLICATION NO. : 11/363038
DATED : April 15, 2008
INVENTOR(S) : Kenji Yamazoe It is certified that error appears in the above-identified patent and that said Letters Patent is hereby corrected as shown below:

COLUMN 13:
      Line 65, "disposition" should read -- deposition --.

Signed and Sealed this

Twenty-first Day of October, 2008

JON W. DUDAS
*Director of the United States Patent and Trademark Office*